(12) United States Patent
Bristol

(10) Patent No.: US 6,963,071 B2
(45) Date of Patent: Nov. 8, 2005

(54) DEBRIS MITIGATION DEVICE

(75) Inventor: Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 250 days.

(21) Appl. No.: 10/304,633

(22) Filed: Nov. 25, 2002

(65) Prior Publication Data

US 2004/0099820 A1     May 27, 2004

(51) Int. Cl.[7] ............................................. H05B 3/26
(52) U.S. Cl. ............................. 250/504 R; 250/493.1; 250/495.1; 378/34; 378/35; 378/119
(58) Field of Search ........................ 250/504 R, 493.1, 250/495.1; 378/34, 35, 119

(56) References Cited

U.S. PATENT DOCUMENTS 5,838,016 A * 11/1998 Johnson .................. 250/504 R
6,421,421 B1 * 7/2002 McGeoch ................. 378/119
6,683,936 B2 * 1/2004 Jonkers ..................... 378/34

* cited by examiner

Primary Examiner—John R. Lee
Assistant Examiner—Paul M. Gurzo
(74) Attorney, Agent, or Firm—Blakely, Sokoloff, Taylor & Zafman LLP

(57) ABSTRACT

Numerous embodiments of a debris mitigation device are disclosed. One embodiment of the claimed subject matter may comprise a debris mitigation device for use in photolithography processes. In one embodiment, the debris mitigation device comprises a foil trap device. The foil trap device, in this embodiment, comprises a plurality of electrically conductive elements and one or more mounting devices, where the plurality of electrically conductive elements are coupled to the one or more mounting devices in such as way as to provide a space between one or more adjacent elements. In this embodiment, the elements are foil elements, and adjacent foil elements carry alternating potentials.

10 Claims, 4 Drawing Sheets

DEBRIS MITIGATION DEVICE

BACKGROUND

Semiconductor devices are typically fabricated using one or more photolithography processes. Continual improvements in photolithography have allowed semiconductor devices to achieve higher density, resulting in an increase in performance. As technology advances and the need for high performance semiconductor devices continues to increase, newer methods of optical lithography must be developed. One method of photolithography uses Extreme Ultraviolet (EUV) light as a lithographic radiation source. EUV light can be produced by creating a small, hot plasma out of a material such as xenon, which may efficiently radiate at a desired wavelength, for example 13.5 nm. The plasma is typically created in a vacuum or low-pressure chamber, typically by driving a pulsed electrical discharge through a fuel material, or by focusing a pulsed laser beam onto a fuel material. The light produced by the plasma is then collected by nearby mirrors and sent downstream to the rest of the lithography tool.

Debris and gases may be released by this plasma, either directly from the fuel material used, or indirectly from the erosion of nearby materials. The debris and gases may travel downstream in the lithography tool and damage sensitive mirrors and other optical components. In addition, the type of fuel used may similarly cause damage. One or more debris mitigation schemes, such as, for example, foil traps, gas curtains, baffling, and shielding may be used to partially block the debris while allowing an open path for the EUV light to pass through. However, some techniques will block debris and gases better than others, and there is a continual need for improved debris mitigation devices.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION

In the following specification, numerous specific details are set forth in order to provide a thorough understanding of the claimed subject matter. However, it will be understood by those skilled in the art that the claimed subject matter may be practiced without these specific details. In other instances, well-known methods, procedures, and components will not be described in detail so as not to obscure disclosed embodiments of the claimed subject matter. It is important to note that any reference in this specification to "one embodiment" or "an embodiment" means that a particular feature, structure or characteristic described in connection with the embodiment is included in at least one embodiment of the claimed subject matter. The use of the phrase "one embodiment" in more than one place in the specification does not necessarily refer to the same embodiment.

Figure 1:
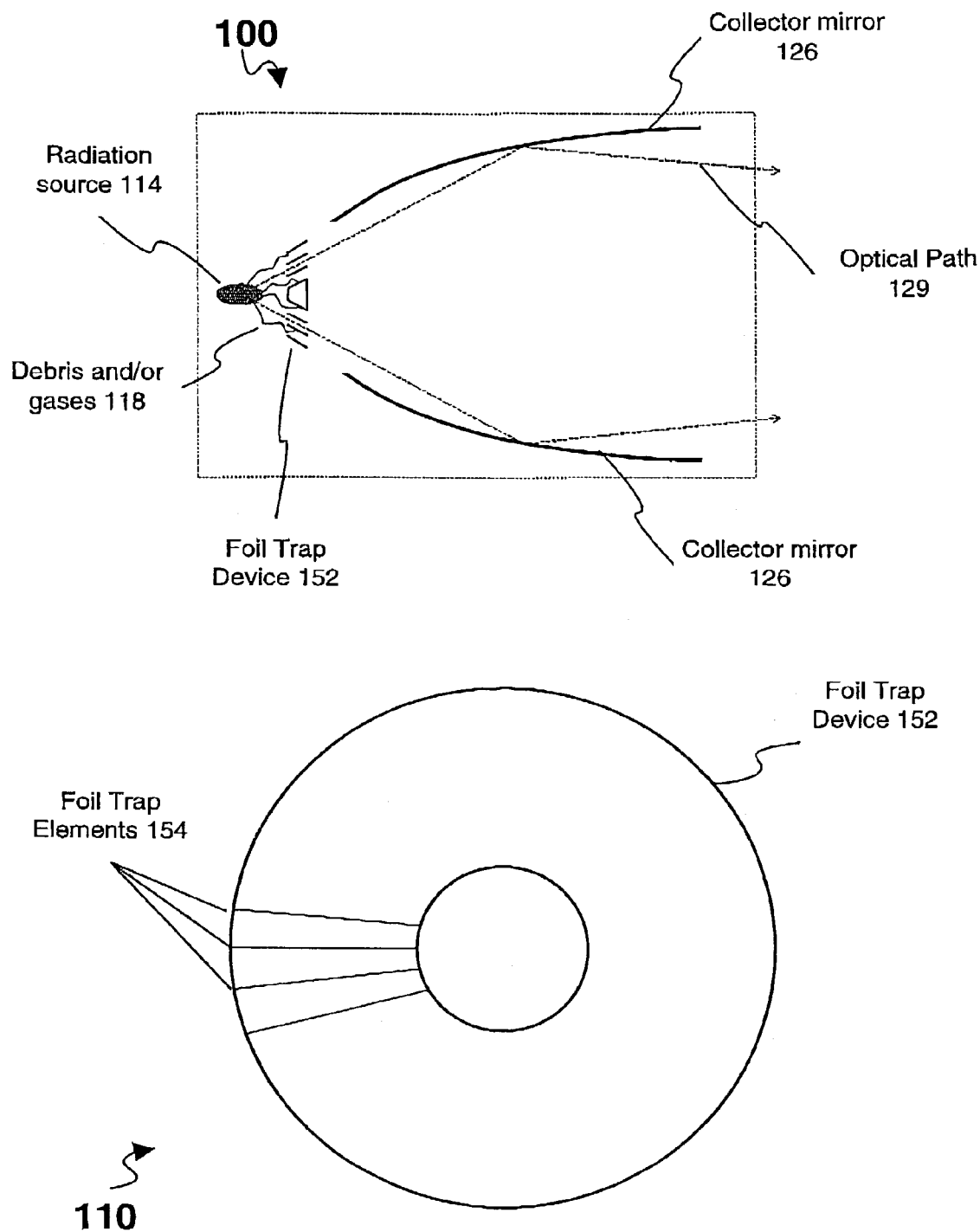
FIG. 1 is a diagram illustrating utilization of a foil trap device in a photolithographic tool.

As stated previously, one method of photolithography may utilize Extreme Ultraviolet (EUV) light as a lithographic radiation source. Photolithography is a fabrication process that may incorporate radiation to transfer mask patterns onto light sensitive substances on a silicon wafer. The wavelength of the radiation source may determine the ultimate resolution of the process, and may determine, for example, the density of circuit elements capable of being fabricated on a particular silicon wafer. Utilization of EUV radiation may result in an increase in the density of circuit elements that may be fabricated on a particular silicon wafer. One photolithography process that may utilize EUV radiation may be best demonstrated by reference to FIG. 1. Referring in detail now to the figures, wherein like parts are designated by like reference numerals, there is illustrated in FIG. 1 a portion of an EUV optical train, comprising radiation source assembly 100, which may be used to generate the EUV radiation in a photolithography tool, for example. Radiation source assembly 100 contains a radiation source 114 that generates a spectrum of radiation (not shown), which may include EUV radiation. Preferably, the wavelength of EUV radiation comprises between about 11 nanometers and about 14 nanometers. More preferably, the wavelength of EUV radiation comprises between about 13 nanometers and about 14 nanometers. Still more preferably, the wavelength of EUV radiation comprises about 13.4 nanometers. At least a portion of the radiation produced by the radiation source may be collected by one or more mirrors such as collector mirrors 126, which may be grazing incidence mirrors, for example.

In operation, radiation source assembly 100 may produce debris, at least partially shown as a debris path 118, either by eroding materials nearby the discharge, or as a byproduct of the plasma itself. Debris 118 may damage or otherwise affect the performance of one or more components of the radiation source assembly, such as the optical components, for example, and may interfere with the optical path 129. Radiation source assembly 100 could include one or more debris mitigation schemes to protect collector mirrors 126 and/or one or more other components from debris 118 generated by source 114. In one example, a foil trap 152 is disposed in between source 114 and collector mirrors 126. In other examples of debris mitigation, not shown in assembly 100, a gas curtain could blow a gas in between source 114 and collector mirrors 126 to prevent debris 118 from damaging reflective surfaces of mirrors 126. In another example, shielding surrounds collector mirrors and prevents debris 118 from reaching grating from outside the optical path 129. Finally, in yet another example, the source assembly 100 could include baffling around the optical path 129 to further mitigate against debris 118.

As stated previously, a debris mitigation device, such as foil trap device 152, may be used to reduce the effects of debris produced in a photolithography process, by incorporating the device in a lithography tool such as in EUV radiation source assembly 100. As shown in 110, foil trap 152 may be comprised of a plurality of foil elements 154, configured such that there is a space between adjacent elements that may allow light to pass through but trap at least a portion of the debris produced during the EUV operation, as stated previously. The plurality of foil elements are typically spaced such that they collect particles due at least in part to the Brownian motion of the particles, and due to the tendency of hot pieces of debris to stick to a relatively cold surface, such as the surface of a foil element 154. The spacing between elements may vary, and may be dependant on such design factors as the operating pressure in the source assembly, or the potential of the foil elements, described in more detail later. Additionally, the thickness of foil elements may be dependent on these factors, as well as other design factors such as the distance between mounting devices and the material used to construct one or more foil elements. One embodiment of a foil trap 152 may contain foil elements 154 with a thickness of 0.1 mm, average element separation of 1 mm, and a foil element depth of 1 cm, although, as stated previously, these values may vary significantly, depending on one or more of the above-mentioned design factors, and the claimed subject matter is not limited in this respect.

As will be explained in more detail hereinafter, while a debris mitigation device such as a foil trap 152 may effectively trap at least a portion of the debris 118 produced by a lithography tool, the device may not trap other debris, and it may be desirable to modify a foil trap device such as device 152, in order to improve the ability to trap debris. In this context, foil may refer to any electrically conductive material that may be suitable for constructing a foil trap, or any material that may be coated with an electrically conductive material such as copper, for example, or may be a combination of materials such as an alloy, although the claimed subject matter is not limited to any particular material or combination of materials for the foil elements.

Embodiments of the claimed subject matter may comprise a debris mitigation device for use in photolithography processes. In one embodiment, the debris mitigation device comprises a foil trap device. The foil trap device, in this embodiment, comprises a plurality of electrically conductive elements and one or more mounting devices, where the plurality of electrically conductive elements are coupled to the one or more mounting devices in such as way as to provide a space between one or more adjacent elements. In this embodiment, the elements are foil elements, and one or more elements may hold a non-zero potential, and the potential of adjacent elements may differ.

Figure 2:
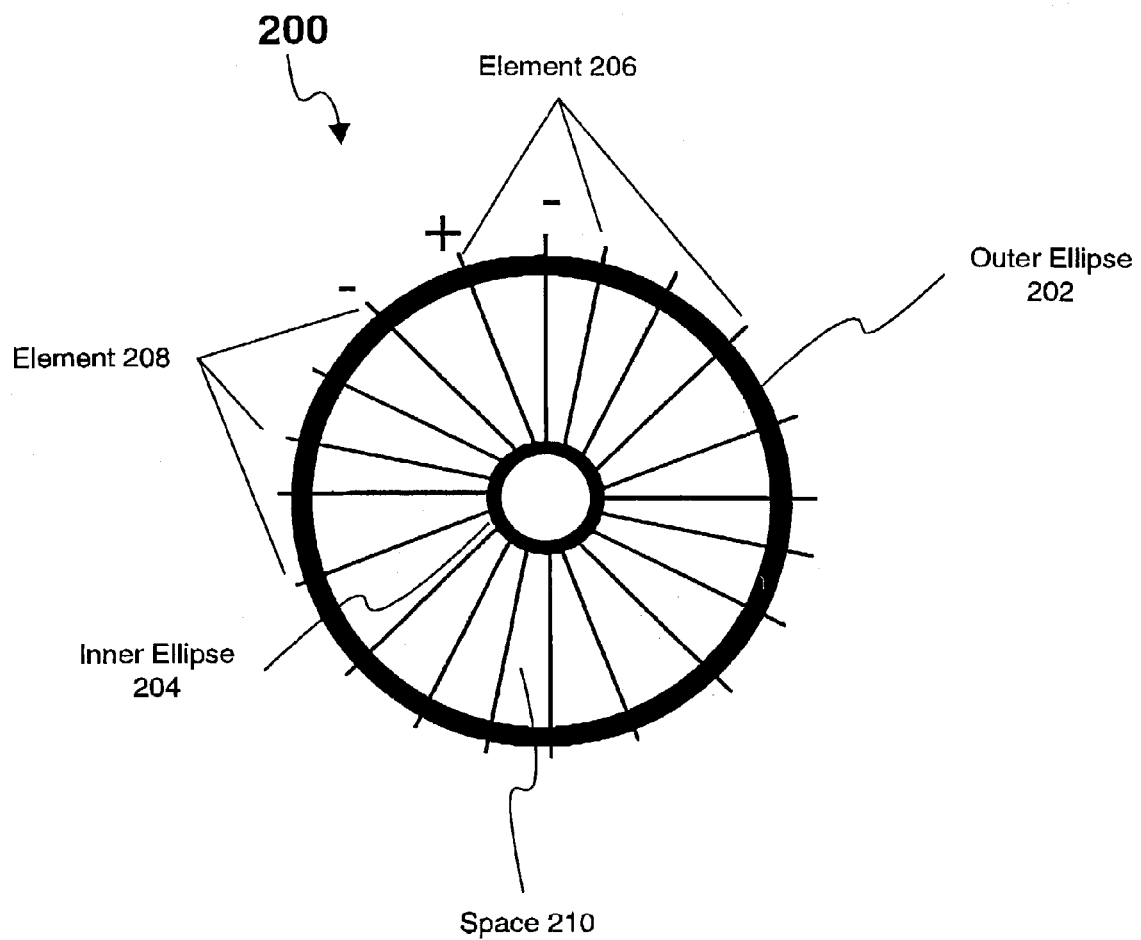
FIG. 2 is a diagram illustrating one embodiment of a debris mitigation device in accordance with the claimed subject matter.

One particular embodiment of the claimed subject matter is shown in FIG. 2. Shown in FIG. 2 is foil trap 200. Although the claimed subject matter is not so limited, foil trap 200 is comprised of a plurality of elements, which may be foil elements, for example, such as elements 206 and 208. Elements 206 and 208 may be comprised of a metal material such as copper, for example, and may be structurally identical, in one embodiment. In this particular embodiment, elements 206 and 208 may be coupled to an outer mounting device and an inner mounting device, such as outer ellipse 202 and inner ellipse 204, wherein the inner and outer ellipses may be circles, for example, although alternative mounting techniques may be employed, as described in more detail hereinafter. Coupling of the plurality of elements to the outer ellipse 202 and inner ellipse 204 results in elements 206 and 208 being separated by a distance, which may vary, providing a space 210 between the elements. The claimed subject matter is not limited to any particular mounting structure or element configuration. For example, elements 206 and 208 may be mounted to a single mounting device such as inner ellipse 204, and have no outer ellipse 202, or may be mounted to a plurality of substantially elliptical devices, that may, for example, mount to particular points along the length of the elements. Also, one or more foil elements may not be substantially planar but may comprise substantially elliptical elements, which may be structurally similar to mounting devices 202 and 204. In this example, one or more mounting devices may comprise substantially planar devices coupling the one or more substantially elliptical foil elements, for example. In addition, elements 206 and 208 may not be radially spaced around one or more substantially elliptical devices, but may, for example, comprise a plurality of parallel elements, that may be mounted substantially perpendicular to one or more substantially planar mounting devices, for example, or may comprise a configuration of elements wherein elements are mounted along the inside periphery of polyhedron such as a rectangle, for example, and, in this case, one or more elements may be mounted perpendicular with respect to each other. It is important to note that while several techniques for mounting one or more foil elements are disclosed, the claimed subject matter may comprise any type of mounting technique that results in a debris mitigation device comprising a plurality of electrically conductive elements, wherein the plurality of elements are coupled to the one or more mounting devices in such a way as to provide a space between one or more of said plurality of elements.

Particles of debris produced in the lithographic light source, such as the one described above, may be positively or negatively charged. As is well known, a positively charged particle will tend to move in with the direction of an electrical field, whereas a negatively charged particle will tend to move against the electrical field. As shown in FIG. 2, elements 206 and 208 of device 200 have differing potentials, specifically in this embodiment, element 206 has a non-zero, or positive potential, and element 208 has a zero potential, resulting in the creation of an electric fields between elements. Although in this particular embodiment, element 206 has a non-zero potential and element 208 has a zero potential, the claimed subject matter is not so limited. For example, elements 206 and 208 may each have a non-zero potential, but the potentials may be differing, resulting in the generation of an electric field between them.

Alternatively, elements of a foil device may have differing potentials that are not necessarily alternating. For example, adjacent elements may have potentials differing by 10 volts, but the potential may increase for each subsequent element. This will result in the generation of an electric field being created between elements. It is also contemplated that potentials of the one or more elements do not have remain constant, for example, one or more elements may be provided with an alternating current, and in this case the potentials of one or more elements may vary over time. The electrical properties of the elements 206 and 208 may attract or repel particles of debris, depending on the electrical characteristics of the particles of debris. Additionally, particles of debris that are electrically neutral may have a dipole moment induced by one or more of the elements 206 and/or 208, and may be attracted to one or the other depending on the particular type of dipole moment that was induced. In order to facilitate the potentials of elements 206 and 208, elements with differing potentials, such as elements 206 and 208, may be electrically isolated from each other and may, for example, be on separate electrical circuits. The method of isolation may vary, but in this particular embodiment, the elements may be electrically isolated by using a non-conductive material such as quartz to construct the one or more mounting devices such as inner ellipse 204 and the outer ellipse 202, for example, or by using a conductive material to construct the one or more mounting devices and the elements, and then providing insulation between elements. It will, of course, be understood that the claimed subject matter is not limited to any particular method of electrical isolation, nor is it limited to any particular electrical scheme.

Figure 3:
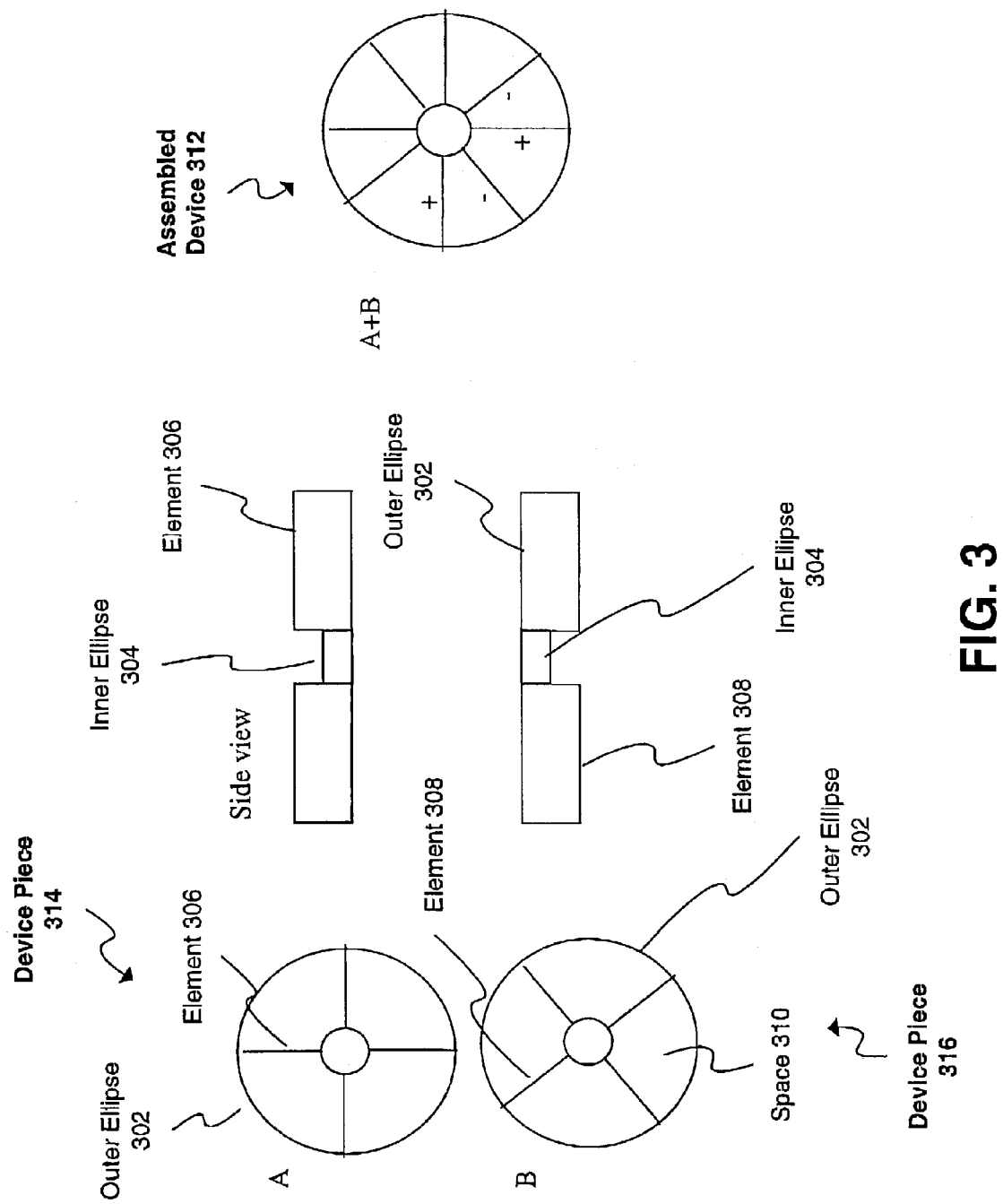
FIG. 3 is a diagram illustrating another embodiment of a debris mitigation device in accordance with the claimed subject matter.

FIG. 3 represents another embodiment of a debris mitigation device, as well as several views of the device partially assembled and fully assembled. Shown in FIG. 3 is assembled device 312, which may be a foil trap device. Assembled device 312 is comprised of two device pieces, piece 314 and piece 316, although the claimed subject matter is not limited to any particular number of pieces. Device piece 314, in this embodiment, is comprised of two mounting devices, inner ellipse 304 and outer ellipse 302. Device piece 314 is additionally comprised of a plurality of elements 306, which may be foil elements, for example. In this embodiment, the plurality of elements 306 may hold a non-zero potential, although the claimed subject matter is not so limited. Device piece 316, in this embodiment, is comprised of two mounting devices, inner ellipse 304 and outer ellipse 302. Device piece 316 is additionally comprised of a plurality of elements 308, which may be foil elements, for example. In this embodiment, elements 308 may hold a zero potential, although the claimed subject matter is not so limited.

It is important to note, as stated previously, that the claimed subject matter is not limited to any particular type or number of mounting devices or to any particular mounting technique, nor is it limited to any particular number of device pieces. Any type of mounting technique or device piece configuration that results in a debris mitigation device comprising a plurality of elements, wherein one or more of the plurality of elements is capable of holding a non-zero potential is in accordance with the claimed subject matter. In this particular embodiment, while the particular method of assembly of device pieces 314 and 316 is not demonstrated in detail in FIG. 3, it may be contemplated by those skilled in the art numerous ways in which to assemble a device such as the various embodiments claims and described. In this particular embodiment, assembly of device 312 may comprise a method of coupling device piece 314 and device piece 316. Each device piece may be electrically isolated from the other, in this embodiment, and this may aid in maintaining the potential held by the one or more elements of each device piece, for example. Conversely, assembly of device 312 may comprise a method of assembly wherein the two device pieces are not coupled, but are in close proximity when installed in a radiation source assembly, for example.

Figure 4:
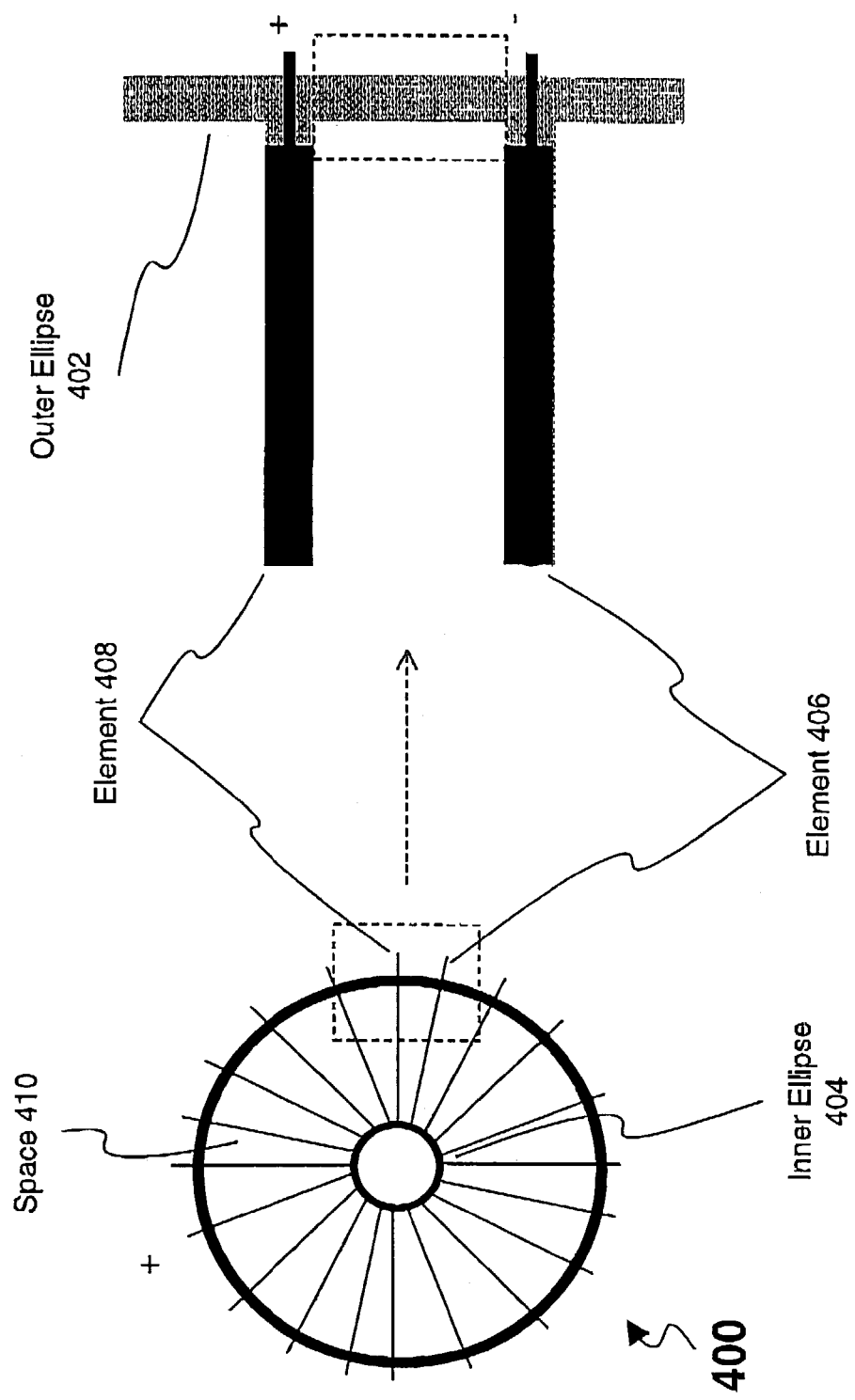
FIG. 4 is a diagram illustrating yet another embodiment of a debris mitigation device in accordance with the claimed subject matter.

FIG. 4 represents yet another embodiment of the claimed subject matter. In this yet another embodiment, there is shown debris mitigation device 400. Debris mitigation device 400, in this yet another embodiment, is comprised of a plurality of elements, represented at least partially by alternating elements 406 and 408. Debris mitigation device 400 additionally comprises one or more mounting devices, such as inner ellipse 404 and outer ellipse 402, for example. In this yet another embodiment, when assembled, elements 406 and 408 may alternate, and may hold one or more potentials. As shown in 400, these elements alternatively hold a non-zero potential and a zero potential, although, as stated previously, alternative electrical schemes in accordance with the claimed subject matter exist. Due at least in part to the alternative potentials of the elements, it may be desirable to electrically isolate the alternating elements. This isolation may be performed, for example, by providing insulation on the inner ellipse 404 and outer ellipse 402, for example. Additionally shown in FIG. 4 is a close-up of 2 elements 406 and 408, coupled to the outer ellipse 402. As can be seen in this close-up, electrical isolation may be provided on outer ellipse 402, and additionally, one or more leads may be fabricated for the elements, to provide, for example, a means of altering electrical characteristics of one or more of the elements.

Fabrication of one or more of the debris mitigation devices may be accomplished by any of a number of ways, all of which are within the scope of the claimed subject matter. For example, one method of fabrication, which may be partially demonstrated by referencing FIG. 2, comprises individual fabrication of device pieces, and subsequent assembly. This particular method of fabrication may be less complex than others, because the elements within each piece may not have to be electrically isolated from each other, for example, as may be necessary in alternative methods. Alternatively, the debris mitigation device may be fabricated as a bulk item. In this particular method, two or more mounting devices, such as an outer ellipse and an inner ellipse, may be constructed out of a non-conductive material such as quartz. These mounting devices may contain one or more slots, suitable for mounting one or more elements, for example. These mounting devices may be coupled by inserting elements, such as foil elements, into the one or more slots. After the elements are inserted, in this embodiment, at least a portion of the one or more mounting devices may be coated with a conductive material such as copper, in order to provide electrical continuity between at least two of the elements mounted to the one or more mounting devices. In this particular embodiment, one or more elements may hold a non-zero potential, and the potential of adjacent elements may differ, for example. Alternatively, one or more mounting devices may be constructed of a conductive material, and the one or more mounting devices may be at least partially coated with an insulating or non-conductive material, resulting in electrical isolation between at least two of the elements mounted to the one or more mounting devices. Also, one or more mounting devices and one or more elements may be constructed of a non-conductive material, and the one or more elements may be at least partially coated with a conductive material, resulting in electrical continuity between at least two of the elements mounted to the one or more mounting devices.

Although some implementations have been described in detail, other embodiments are also within the scope of the following claims. Additionally, many modifications, substitutions, changes, and equivalents will now occur to those skilled in the art. It is, therefore, to be understood that the appended claims are intended to cover all such embodiments and changes as fall within the true spirit of the claimed subject matter.

What is claimed is:

1. A debris mitigation device, comprising:
 a plurality of electrically conductive elements, wherein the electrical potential of at least one of the electrically conductive elements differs from at least one other of the electrically conductive elements; and
 at least one mounting device, wherein one or more of the plurality of electrically conductive elements are coupled to the at least one mounting device, wherein the one or more elements, when coupled, are separated from adjacent elements by a distance, wherein said separation provides a space between one or more of said plurality of elements.

2. The debris mitigation device of claim 1, wherein said plurality of elements are electrically separated into at least two electrical circuits.

3. The debris mitigation device of claim 1, wherein at least one of said plurality of elements carries a zero potential, and at least one of said plurality of elements carries a non-zero potential.

4. The debris mitigation device of claim 3, wherein the potential of one or more elements varies over time.

5. The debris mitigation device of claim 1, wherein said elements comprise foil elements.

6. The debris mitigation device of claim 1, wherein said at least one mounting device comprises a substantially elliptical device.

7. The debris mitigation device of claim 1, wherein said at least one mounting device comprise a polyhedron.

8. The debris mitigation device of claim 1, wherein said at least one mounting device comprises a substantially planar device.

9. The debris mitigation device of claim 1, wherein said at least one mounting device is non-conductive.

10. The debris mitigation device of claim 1, wherein the average of said distance comprises about 1 mm.

* * * * *